US010685962B2

(12) United States Patent
Lin et al.

(10) Patent No.: US 10,685,962 B2
(45) Date of Patent: Jun. 16, 2020

(54) DYNAMIC RANDOM ACCESS MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Xi Lin, Shanghai (CN); Yi Hua Shen, Shanghai (CN)

(73) Assignees: Semiconductor Manufacrturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/805,851

(22) Filed: Nov. 7, 2017

(65) Prior Publication Data

US 2018/0138183 A1 May 17, 2018

(30) Foreign Application Priority Data

Nov. 11, 2016 (CN) .......................... 2016 1 0994767

(51) Int. Cl.
*H01L 27/108* (2006.01)
*H01L 21/768* (2006.01)
(Continued)

(52) U.S. Cl.
CPC ...... *H01L 27/10852* (2013.01); *H01L 21/768* (2013.01); *H01L 27/10805* (2013.01);
(Continued)

(58) Field of Classification Search
CPC ................. H01L 21/768; H01L 27/108; H01L 27/10852; H01L 45/04
(Continued)

(56) References Cited

U.S. PATENT DOCUMENTS 4,897,700 A * 1/1990 Nakamura ............ G11C 11/404
257/298
5,401,681 A 3/1995 Dennison
(Continued)

FOREIGN PATENT DOCUMENTS

EP 2202816 A1 6/2010
WO WO2008087499 * 1/2007

OTHER PUBLICATIONS

The European Patent Office (EPO) The Extended European Search Report for 17200237.0 dated Apr. 5, 2018 10 Pages.

*Primary Examiner* — Fazli Erdem
(74) *Attorney, Agent, or Firm* — Anova Law Group, PLLC

(57) ABSTRACT

Dynamic random access memory (DRAM) and fabrication methods thereof are provided. An exemplary fabrication method includes providing a base substrate; forming a gate structure over the base substrate; forming doped source/drain regions in the base substrate at two sides of the gate structure, respectively; forming an interlayer dielectric layer over the gate structure, the base substrate and the doped source/drain regions; forming a first opening, exposing one of the doped source/drain regions at one side of the gate structure, in the interlayer dielectric layer; and forming a memory structure in the first opening and on the one of doped source/drain regions.

20 Claims, 3 Drawing Sheets

(51) Int. Cl.
*H01L 27/24* (2006.01)
*H01L 45/00* (2006.01)
*H01L 49/02* (2006.01)

(52) U.S. Cl.
CPC .. *H01L 27/10808* (2013.01); *H01L 27/10826* (2013.01); *H01L 27/10879* (2013.01); *H01L 27/10885* (2013.01); *H01L 27/2436* (2013.01); *H01L 28/40* (2013.01); *H01L 28/82* (2013.01); *H01L 45/04* (2013.01); *H01L 45/06* (2013.01); *H01L 45/065* (2013.01); *H01L 45/085* (2013.01); *H01L 45/124* (2013.01); *H01L 45/1253* (2013.01); *H01L 45/144* (2013.01); *H01L 45/146* (2013.01); *H01L 45/147* (2013.01); *H01L 45/16* (2013.01); *H01L 45/1683* (2013.01)

(58) Field of Classification Search
USPC .......................................................... 257/4
See application file for complete search history.

(56) References Cited

U.S. PATENT DOCUMENTS

| | | | |
|---|---|---|---|
| 9,761,679 B2* | 9/2017 | Chang | H01L 21/823418 |
| 2005/0035342 A1* | 2/2005 | Chen | H01L 27/2436 |
| | | | 257/2 |
| 2006/0046398 A1* | 3/2006 | McDaniel | H01L 21/02068 |
| | | | 438/279 |
| 2009/0085121 A1* | 4/2009 | Park | H01L 27/228 |
| | | | 257/368 |
| 2010/0155687 A1* | 6/2010 | Reyes | H01L 45/04 |
| | | | 257/4 |
| 2011/0084325 A1* | 4/2011 | Wang | H01L 21/76229 |
| | | | 257/296 |
| 2014/0065782 A1 | 3/2014 | Lu et al. | |
| 2016/0308016 A1* | 10/2016 | Choi | H01L 29/41791 |
| 2016/0379982 A1* | 12/2016 | You | H01L 29/0657 |
| | | | 257/369 |
| 2017/0092692 A1* | 3/2017 | Kalnitsky | H01L 43/12 |
| 2018/0130886 A1* | 5/2018 | Kim | H01L 21/823814 |
| 2018/0138184 A1* | 5/2018 | Lin | H01L 45/04 |

* cited by examiner

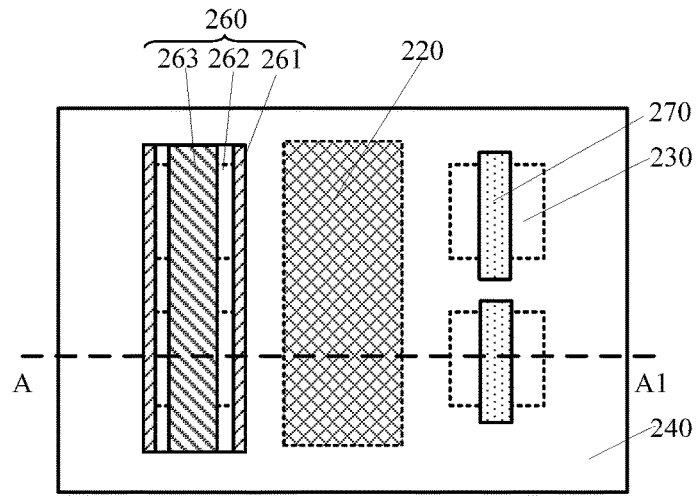

FIG. 5

| S101 |
| --- |
| Providing a base substrate having a least one gate structure and an interlayer dielectric layer, and doped source/drain regions in the base substrate at two sides of the gate structure, respectively |

| S102 |
| --- |
| Forming a first opening in the interlayer dielectric layer at one side of the gate structure to expose the doped source/drain region |

| S103 |
| --- |
| Forming a memory structure and a bit-line layer |

FIG. 6

DYNAMIC RANDOM ACCESS MEMORY AND FABRICATION METHOD THEREOF

CROSS-REFERENCES TO RELATED APPLICATIONS

This application claims the priority of Chinese patent application No. 201610994767.X, filed on Nov. 11, 2016, the entirety of which is incorporated herein by reference.

FIELD OF THE DISCLOSURE

The present disclosure generally relates to the field of semiconductor manufacturing technologies and, more particularly, relates to dynamic random access memory (DRAM) and fabrication methods thereof.

BACKGROUND

Dynamic random access memory (DRAM) often includes a memory cell, including a memory capacitor, and a transistor connected with the memory capacitor. The memory capacitor is used to store data; and the transistor is used to control the data storage of the memory capacitor.

The working mechanism of the DRAM is as the following. The word line of the DRAM is electrically connected to the gate of the transistor in the memory cell to control the "on/off" of the transistor. The source of the DRAM is electrically connected to the source of the transistor to form a current transport path. The drain of the transistor is connected to the memory base substrate to store and/or output data.

Currently, in the commonly used DRAM, the memory capacitor is often designed to be a trench capacitor, or a stacked capacitor. The trench capacitor is buried in a semiconductor substrate. The stacked transistor is stacked on a semiconductor substrate.

However, the fabrication process of the existing DRAM is complicated. The disclosed methods and structures are directed to solve one or more problems set forth above and other problems in the art.

BRIEF SUMMARY OF THE DISCLOSURE

One aspect of the present disclosure includes a method for fabricating a dynamic random access memory (DRAM). The method includes providing a base substrate; forming a gate structure over the base substrate; forming doped source/drain regions in the base substrate at two sides of the gate structure, respectively; forming an interlayer dielectric layer over the gate structure, the base substrate and the doped source/drain regions; forming a first opening, exposing one of the doped source/drain regions at one side of the gate structure, in the interlayer dielectric layer; and forming a memory structure in the first opening and on the one of doped source/drain regions.

Another aspect of the present disclosure includes a dynamic random access memory (DRAM). The dynamic random access memory includes a base substrate; a gate structure formed over the base substrate; doped source/drain regions formed in the base substrate at two sides of the gate structure, respectively; an interlayer dielectric layer formed on the gate structure, the base substrate and the doped source/drain regions, wherein the interlayer dielectric layer contains a first opening exposing the doped source/drain regions at one side of the gate structure; and a memory structure, having a first conductive layer on side and bottom surfaces of the first opening, a memory medium layer on the first conductive layer and a second conductive layer on the memory medium layer, formed in the interlayer dielectric layer.

Other aspects of the present disclosure can be understood by those skilled in the art in light of the description, the claims, and the drawings of the present disclosure.

BRIEF DESCRIPTION OF THE DRAWINGS

FIGS. 2-5 illustrate semiconductor structures corresponding to certain stages of forming an exemplary DRAM consistent with the disclosed embodiments; and FIG. 6 illustrates an exemplary fabrication process of a DRAM consistent with the disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
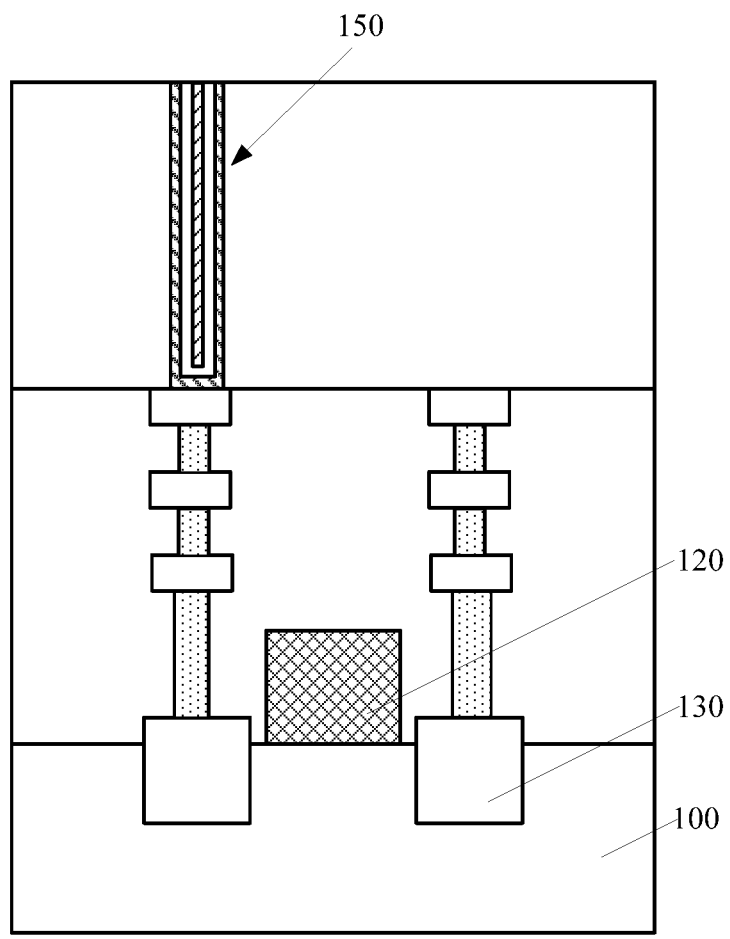
FIG. 1 illustrates a dynamic random access memory (DRAM)

FIG. 1 illustrates a DRAM. As shown in FIG. 1, the DRAM includes a semiconductor substrate 100; a select transistor (not labeled) formed on the semiconductor substrate 100; an interconnect structure (not labeled) formed on the select transistor; a dielectric layer (not labeled) formed on the interconnect structure; a trench (not labeled) passing through the interlayer dielectric layer and exposing the top surface of the interconnect structure formed in the interlayer dielectric layer; and a capacitor (memory) structure 150 formed in the trench.

The capacitor structure 150 includes a first conductive layer formed on the side and bottom surfaces of the trench; a memory medium layer formed on the first conductive layer; and a second conductive layer formed on the memory medium layer.

The select transistor includes a gate structure 100 formed on the semiconductor substrate 100, and doped source/drain regions 130 formed in the semiconductor substrate 100 at two sides of the gate structure 120, respectively. The capacitor structure 150 is connected to the doped source/drain regions 130 by the interconnect structure.

However, the fabrication process of such a DRAM is complicated. For example, to improve the memory properties of the capacitor (memory) structure 150, it may need the first conductive layer, the memory medium layer and the second conductive layer to have large dimensions along a direction perpendicular to the surface of the semiconductor substrate 100. Thus, the depth of the trench has to be increased. The trench having the increased depth requires the interlayer dielectric layer in which the trench is formed to have an increased thickness. The interlayer dielectric layer having the increased thickness may be unsuitable to be used as the interlayer dielectric layer of the front-end-of-line (FEOL) processes. Thus, the capacitor structure 150 cannot be formed during the FEOL processes of the CMOS process. Accordingly, the capacitor structure 150 is formed above the CMOS devices after forming the CMOS devices. Thus, the capacitor structure 150 is not directly in contact with the doped source/drain regions 130. To achieve the electrical connection between the capacitor structure 150 and the doped source/drain regions 130, a multi-layer interconnect structure (not labeled) needs to be formed between the capacitor structure 150 and the doped source/drain regions 130. Thus, the fabrication process of the DRAM is complicated.

The present disclosure provides a DRAM and a fabrication method thereof. For example, a gate structure and an interlayer dielectric layer may be formed on a base substrate. Doped source/drain regions may be formed in the base substrate at two sides of the gate structure, respectively. The interlayer dielectric layer may be formed on the surfaces of the gate structure, the base substrate and the doped source/drain regions. The method may also include forming a first opening exposing one of the doped source/drain regions at one side of the gate structure in the interlayer dielectric layer; and forming a memory structure in the first opening. The memory structure may include a first conductive layer formed on the side and bottom surfaces of the first opening, a memory medium layer formed on the first conductive layer, and a second conductive layer formed on the memory medium layer.

In the disclosed methods, the interlayer dielectric layer may be formed on the surfaces of the gate structure, the base substrate and the doped source/drain regions; and the first opening exposing one of the doped source/drain regions at one side of the gate structure may be formed in the interlayer dielectric layer. After forming the memory structure in the first opening the memory structure may be directly in contact with the doped source/drain region at the one side of the gate structure. The memory structure and the doped source/drain region may not need a multiple-layer interconnect structure to have an electrical connection. Thus, the fabrication process of the DRAM may be simplified.

FIG. 6 illustrates an exemplary fabrication process of a DRAM consistent with the disclosed embodiments. FIGS. 2-5 illustrate semiconductor structures corresponding to certain stages of the exemplary fabrication process.

Figure 2:
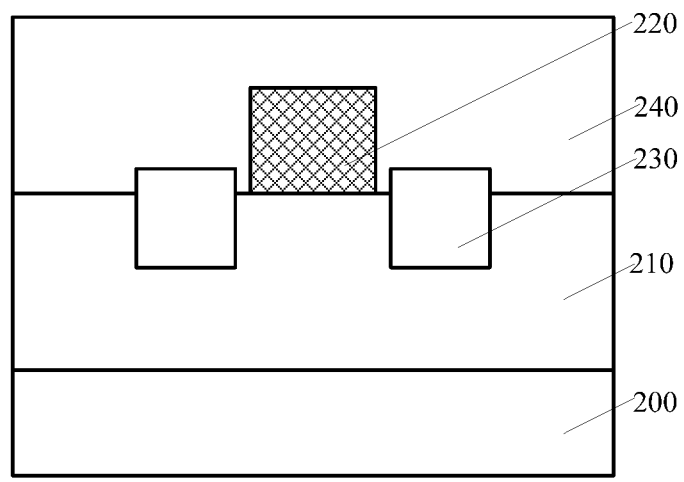

As shown in FIG. 6, at the beginning of the fabrication process, a base substrate with certain structures is provided (S101). FIG. 2 illustrates a corresponding semiconductor structure.

As shown in FIG. 2, a base substrate is provided. The base substrate may have at least one gate structure 220 and an interlayer dielectric layer 240 on its surface. That is, at least one gate structure 220 and an interlayer dielectric layer 240 may be formed on the surface of the base substrate. Further, doped source/drain regions 230 may be formed in the base substrate at two sides of the gate structure 220, respectively. The interlayer dielectric layer 240 may be on the surfaces of the gate structure 220, the base substrate and the doped source/drain regions 230.

In one embodiment, the base substrate may include a semiconductor substrate 200 and a plurality of fins 210 formed on the semiconductor substrate 200. In some embodiments, the base substrate may be only a planar semiconductor substrate. The semiconductor substrate 200 provides a process platform for forming the DRAM.

The semiconductor substrate 200 may be made of single crystalline silicon, polysilicon, or amorphous silicon. The semiconductor substrate 200 may also be made of other appropriate material, such as silicon, germanium, or silicon germanium, etc. In one embodiment, the semiconductor substrate 200 is made of single crystalline silicon.

In one embodiment, the plurality of fins 210 may be formed by patterning the semiconductor substrate 200. In some embodiments, the plurality of fins may be formed by forming a fin material layer on the semiconductor substrate, followed by patterning the fin material layer.

The number of fins 210 may be equal to, or greater than one. If the number of the fins 210 is greater than one, the distribution direction of the plurality of fins 210 may be perpendicular to the length direction of the plurality of fins 210.

Further, an isolation structure (not shown) may be formed on the semiconductor substrate 200. The isolation structure may cover the side surfaces of the fins 210 parallel to the length direction of the fins 210. The surface of the isolation structure may be below the top surfaces of the fins 210.

The isolation structure may be made of any appropriate material. In one embodiment, the isolation structure is made of silicon oxide.

In one embodiment, the gate structure 220 may cross over the fins 210; and cover portions of side and top surfaces of the fins 210.

The gate structure 220 may include a gate dielectric layer formed over the base substrate; and a gate electrode layer formed on the gate dielectric layer. Specifically, the gate dielectric layer may be formed on a portion of the isolation structure; and cover portions of the side and top surfaces of the fins 210.

In one embodiment, the gate dielectric layer may be made of a high-K dielectric material (e.g., K>3.9). The gate electrode layer may be made of a metal.

The interlayer dielectric layer 240 may be made of silicon oxide, silicon oxynitride, or silicon oxycarbide, etc. The interlayer dielectric layer 240 may also be on the isolation structure.

In one embodiment, the method for forming the at least one gate structure 220, the doped source/drain regions 230 and the interlayer dielectric layer 240 may include forming a dummy gate structure over the base substrate. The dummy gate structure may include a dummy gate dielectric layer formed over the base substrate; and a dummy gate electrode layer formed on the dummy gate dielectric layer. The method may also include forming the doped source/drain regions 230 in the base substrate at the two sides of the dummy gate structure, respectively. Further, the method may include forming a first interlayer dielectric layer over the base substrate. The first interlayer dielectric layer may expose the top surface of the dummy gate structure; and may cover the doped source/drain regions 230 and the side surfaces of the dummy gate structure. Further, the method may also include removing the dummy gate electrode layer to form an opening; and forming a gate electrode layer in the opening. Further, the method may also include forming a second interlayer dielectric layer on the surface of the first interlayer dielectric layer and the gate electrode layer. The second interlayer dielectric layer and the first dielectric layer may form the interlayer dielectric layer 240.

The dummy gate electrode layer may be made of any appropriate material. In one embodiment, the dummy gate electrode layer is made of polysilicon.

In one embodiment, when the dummy gate dielectric layer is made of silicon oxide. The method for forming the gate structure may also include removing the dummy gate dielectric layer after removing the dummy gate electrode layer to form the opening. Before forming the gate electrode layer in the opening, a gate dielectric layer may be formed on the side and bottom surfaces of the opening.

In some embodiments, when the dummy gate dielectric layer is made of high-K dielectric material, after forming the opening, the dummy gate dielectric may be used as the gate dielectric layer.

In some embodiments, the gate dielectric layer is made of silicon oxide, the gate electrode layer is made of polysilicon.

Correspondingly, the process for forming the dummy gate structure, the doped source/drain regions and the interlayer dielectric layer may include forming a gate structure over the base substrate; forming doped source/drain regions in the base substrate at two sides of the gate structure, respectively; and forming an interlayer dielectric layer on the surfaces of the gate structure, the base substrate and the doped source/drain regions.

The gate structure 220 may have a first side and an opposing second side. The first side and the second side may expose the source/drain regions 230 at the two sides of the gate structure 220, respectively.

Figure 3:
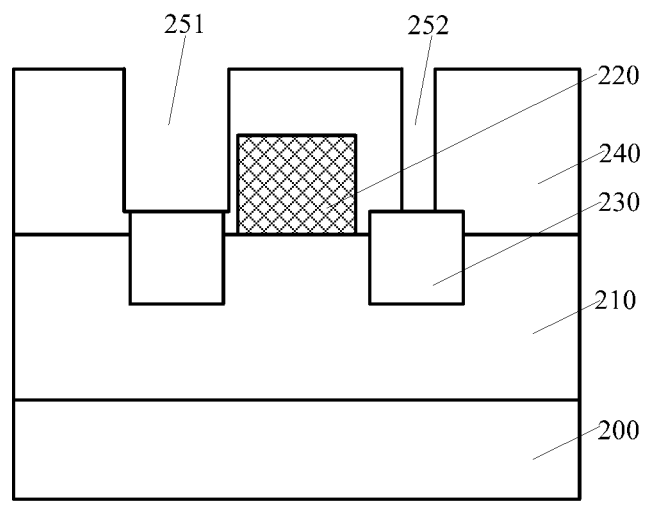

Returning to FIG. 6, after providing the base substrate having the certain structures, a first opening may be formed (S102). FIG. 3 illustrates a corresponding semiconductor structure.

As shown in FIG. 3, a first opening 251 is formed in the interlayer dielectric layer 240. The first opening 251 may expose one of the doped source/drain regions 230 at one side of the gate structure 220. Specifically, in one embodiment, the first opening 251 may be at the first side of the gate structure 220; and may expose one doped source/drain region 230 at the first side of the gate structure 220. The first opening 251 may be used to subsequently form a memory structure.

Further, in one embodiment, a second opening 252 may also be formed in the interlayer dielectric layer 240. The second opening 252 may expose one of the doped source/drain region 230 at the second side of the gate structure 220. The second opening 252 may be used to subsequently form a bit-line layer.

In one embodiment, the first opening 251 and the second opening 252 may be formed by a same process. Thus, the fabrication process may be simplified. In some embodiments, the first opening and the second opening may be formed separately.

The first opening 251 and the second opening 252 may be formed by any appropriate process, such as a dry etching process, a wet etching process, or an ion beam etching process, etc.

Figure 4:
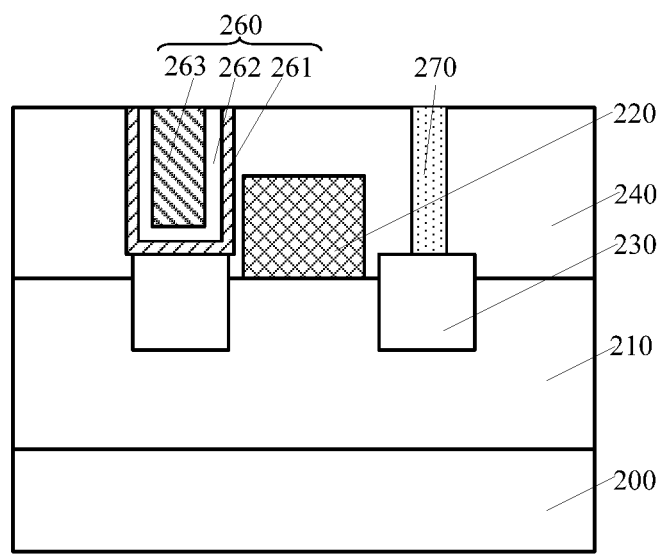

Returning to FIG. 6, after forming the first opening 251 and the second opening 252, a memory structure and a bit-line layer may be formed (S103). FIGS. 4-5 illustrate a corresponding semiconductor structure. FIG. 4 is a cross-sectional view of the structure illustrated in FIG. 5 along the A-A1 direction; and FIG. 5 is a top view of the structure illustrated in FIG. 4.

As shown in FIGS. 4-5, a memory structure 260 is formed in the first opening 251. Further, a bit-line layer 270 is formed in the second opening 252.

The memory structure 260 may include a first conductive layer 261 formed on the side and bottom surfaces of the first opening 251, a memory medium layer 262 formed on the first conductive layer 261 in the first opening 251, and a second conductive layer 263 formed on the memory medium layer 262 in the first opening 251. In one embodiment, the number of the doped source/drain regions 230 along a direction parallel to the length direction of the gate structure 220 and at the first side of the gate structure 220 may be more than one. Correspondingly, the number of the first conductive layers 261 along the direction parallel to the length direction of the gate structure 220 may also be greater than one. Each of the plurality of the first conductive layers 261 may be formed on the surface of a corresponding first doped source/drain region 230 at the first side of the gate structure 220, respectively. The first conductive layers 261 may be distributed discretely. Thus, the plurality of first conductive layers 261 at the first side of the gate structure 220 may be electrically insulated to each other. Each of the memory structures 260 corresponding to the first conductive layers 261 at the first side of the gate structure 220 may be able to operate independently.

In some embodiments, the number of the doped source/drain region at the first side of the gate structure is one; and the number of the doped source/drain region at the second side of the gate structure is one.

In one embodiment, the first opening 251 may also extend to the base substrate between adjacent doped source/drain regions 230 at the first side of the gate structure 220 along the direction parallel to the length direction of the gate structure 220.

The first conductive layer 261 may be made of any appropriate material. In one embodiment, the first conductive layer 261 is made of a metal material.

In one embodiment, the method for forming the first conductive layer 261 may include forming a first initial conductive material layer on the side and bottom surfaces of the first opening 251 and on portions of the base substrate between adjacent doped source/drain regions 230, followed by removing the portions of the first initial conductive material layer on the base substrate between adjacent doped source/drain regions 230. Thus, the first conductive layer 261 may be formed.

The first initial conductive material layer may be formed by any appropriate process, such as a deposition process, etc. The deposition process may include a plasma-enhanced chemical vapor deposition (PECVD) process, a low-pressure chemical vapor deposition (LPCVD) process, a sub-atmosphere chemical vapor deposition (SACVD) process, or an atomic layer deposition (ALD) process, etc. The portions of the first initial conductive material layer on the base substrate between adjacent doped source/drain regions 230 may be removed by an etching process with an etching mask, such as a dry etching process, or a wet etching process, etc.

In one embodiment, the first initial conductive material layer may also be formed on the side and bottom surfaces of the second opening 252 and on the surface of the interlayer dielectric layer 240. During the process for removing the portions of the first initial conductive material layer on the base substrate between adjacent doped source/drain regions 230, the entire portion of the first initial conductive material layer in the second opening 252 may also be removed. The first conductive layer 261 may also be formed on a portion of the interlayer dielectric layer 240.

In one embodiment, the memory medium layer 262 may also be formed on the interlayer dielectric layer 240. A process for forming the memory medium layer 262 may include forming an initial memory medium layer on the side and bottom surfaces of the first opening 251 and the second opening 252 and on the surface of the interlayer dielectric layer 240. The initial memory medium layer may be formed on the first conductive layer 261. Then, the portion of the initial memory medium layer on the side surface and the bottom surface of the second opening 252 may be removed. Thus, the memory medium layer 262 may be formed on the first conductive layer 251 in the first opening 251.

The initial memory medium layer may be formed by a deposition process. The deposition process may include a PECVD process, an LPCVD process, an SACVD process, or an ALD process, etc. The portions of the initial memory medium layer on the side and bottom surfaces of the second opening 252 may be removed by an etching process with an etching mask, such as a dry etching process, or a wet etching process, etc.

In one embodiment, the memory medium layer 262 is made of a resistance-change material. The memory structure 260 may be a resistance-change memory structure (RRAM). The resistance-change material may include hafnium oxide$_2$, zirconium oxide, copper oxide, or zinc oxide, etc.

In another embodiment, the memory medium layer 262 is made of a phase-change material. The memory structure 260 may be a phase-change memory structure. The phase-change material may include chalcogenide, or germanium, antimony and/or tellurium compounds, etc.

When the memory medium layer 262 is made of the resistive-change or the phase-change material, the bit-cell of the DRAM may be stable. The memory structure 260 may not lose the stored information when the power of the memory structure 260 is lost. Thus, the performance of the DRAM having such a memory structure 260 may be as desired.

In some embodiments, the memory medium layer 262 may be made of a capacitive medium material. The memory structure 260 may be a capacitive memory structure. The capacitive medium material may include hafnium oxide, aluminum oxide, or zirconium oxide, etc.

Referring to FIGS. 4-5, in one embodiment, the bit-line layer 270 may be formed during the process for forming the memory structure 260.

In one embodiment, the second conductive layer 263 may also be formed on the interlayer dielectric layer 240. During the process for forming the second conductive layer 263, the bit-line layer 270 may be formed in the second opening 252.

The second conductive layer 263 may be made of any appropriate material. In one embodiment, the second conductive layer 263 is made of a metal material.

In one embodiment, the process for forming the second conductive layer 263 and the bit-line layer 270 may include forming a conductive film in the first opening 251 and the second opening 252. The portion of the conductive film in the first opening 251 and on the interlayer dielectric layer 240 may form the second conductive layer 263. The portion of the conductive film in the second opening 252 may form the bit-line layer 270.

The conductive film may be formed by any appropriate process, such as a deposition process, etc. The deposition process may include a PECVD process, an LPCVD process, an SACVD process, or an ALD process, etc.

In one embodiment, the second opening 252 may also extend to the base substrate between adjacent doped source/drain regions 230 at the second side of the gate structure 220 along the direction parallel to the length direction of the gate structure 220.

In one embodiment, the number of the doped source/drain regions 230 at the first side of the gate structure 220 along the direction parallel to the length direction of the gate structure 220 may be more than one. The number of the doped source/drain regions 230 at the second side of the gate structure 220 along the direction parallel to the length direction of the gate structure 220 may be more than one. Thus, the number of the bit-line layers 270 along the direction parallel to the length direction of the gate structure 220 may be more than one. Each bit-line layer 270 may be formed on a corresponding doped source/drain region 230 at the second side of the gate structure 220; and the bit-line layers 270 may be distributed discretely.

The bit line layer 270 may be made of any appropriate material. In one embodiment, the bit-line layer 270 is made of a metal material.

In one embodiment, the method for forming the second conductive layer 263 and the bit-line layer 270 may further include removing the portions of the conductive film on the base substrate between adjacent doped source/drain regions 230 at the second side of the gate structure 220. Such a step may cause each bit-line layer 270 on the corresponding doped source/drain regions 230 to be distributed discretely.

Various processes may be used to remove the portions of the conductive film on the base substrate between adjacent doped source/drain regions 230 at the second side of the gate structure 220. In one embodiment, an etching process is used to remove the portions of the conductive film on the base substrate between adjacent doped source/drain regions 230 at the second side of the gate structure 220. The etching process may be a dry etching process, or a wet etching process, etc.

In one embodiment, after forming the memory structure 260, the portions of the second conductive layer 263, the memory medium layer 262 and the first conductive layer 261 above the interlayer dielectric layer 240 may be removed. Various processes may be used to remove the portions of the second conductive layer 263, the memory medium layer 262 and the first conductive layer 261 above the interlayer dielectric layer 240, such as a planarization process. The planarization process may include a chemical mechanical polishing process, etc.

After removing the portions of the second conductive layer 263, the memory medium layer 262 and the first conductive layer 261 above the interlayer dielectric layer 240, the top surface of the first conductive layer 261 on the side surface of the first opening 251 may level with the top surface of the interlayer dielectric layer 240.

In some embodiments, the first opening and the second opening may be formed separately. The memory structure and the bit-line layers may be formed separately in different processes. Correspondingly, the method for forming the bit-line layers may include forming an initial bit-line layer on the side and bottom surfaces of the second opening and on the base substrate between adjacent doped source/drain regions and on the interlayer dielectric layer; and removing the portions of the initial bit-line layer on the base substrate between adjacent doped source/drain regions and on the interlayer dielectric layer. Thus, the bit-line layers may be formed.

In some embodiments, the top surface of the first conductive layer on the side surface of the first opening may be below the top surface of the interlayer dielectric layer. Correspondingly, when the top surface of the first conductive layer on the side surface of the first opening is below the top surface of the interlayer dielectric layer, the process for forming the first conductive layer may include forming an initial first conductive film on the side and bottom surfaces of the first opening and on the interlayer dielectric layer; forming a sacrificial layer with a surface below the top surface of the interlayer dielectric layer in first opening; removing a portion of the first conductive film on a top portion of the side surface of the first opening and on the interlayer dielectric layer to form the first conductive layer; and removing the sacrificial layer.

The sacrificial layer may be made of any appropriate material, such as organic polymer, etc. The organic polymer may include antireflective layer, etc.

The process for forming the sacrificial layer may include forming a sacrificial material layer in the first opening and on the interlayer dielectric layer; and removing a portion of the sacrificial material layer on the interlayer dielectric layer and a top portion of the sacrificial film in the first opening to form the sacrificial layer. The sacrificial material layer may be formed by a spin-coating process.

In one embodiment, the surface of the sacrificial layer is below, or levels with the top surface of the isolation structure. Correspondingly, the top surface of the first conductive layer on the side surface of the first opening may be below, or may level with the top surface of the isolation structure. When the plurality of fins are distributed along a direction perpendicular to the length direction of the fins, the first conductive layers in different fins may be discretely distributed. Thus, the first conductive layers in different fins may be electrically insulated. At the same time, the top surface of the first conducive layer on the side surface of the first opening may be below the top surface of the interlayer dielectric layer.

In some embodiments, the surface of the sacrificial layer may be above the top surface of the isolation structure and below the top surface of the interlayer dielectric layer. Under such a configuration, if the discrete distribution of the first conductive layer at different fins is needed, it may need an extra etching process to remove the first initial conductive layer between the adjacent fins along the a direction perpendicular to the length direction of the fins.

After forming the first conductive layer, the memory medium layer and the second conductive layer may be formed. The memory medium layer may be on the surface of the first conductive layer and the side surface of the first opening exposed by the first opening, the second conductive layer may be on the surface of the memory medium layer. Correspondingly, the process for forming the memory medium layer and the second conductive layer may include forming an initial memory material layer on the surface of the first conductive layer and the side surface of the first opening exposed by the first conductive layer and on the surface of the interlayer dielectric layer; forming a second initial conductive layer on the initial memory material layer; removing the portions of the initial memory material layer and the second initial conductive layer above the interlayer dielectric layer. Thus, the memory medium layer and the second conductive layer may be formed in the first opening.

Because the top surface of the first conductive layer on the side surface of the first opening may be below the top surface of the interlayer dielectric layer, the memory medium layer may be able to cover the entire surface of the first conductive layer. Thus, the conductive line for connecting the second conductive layer may not need to precisely align with the second conductive layer to avoid a short-circuit between the first conductive layer and the second conductive layer. Accordingly, the process difficulty of the conductive line for connecting the second conductive layer may be reduced.

In one embodiment, the interlayer dielectric layer 240 may be formed on the surfaces of the gate structure 220, the base substrate and the doped source/drain regions 230; and the first opening 251 exposing the doped source/drain region at one side of the gate structure 220 may be formed in the interlayer dielectric layer 240. After forming the memory structure 260 in the first opening 251, the memory structure 260 may be able to be directly in contact with the doped source/drain region 230 at one side of the gate structure. Thus, the memory structure 260 and the doped source/drain region 230 may have a direct electrical connection without using a multiple-layer interconnect structure. Accordingly, the fabrication process of the DRAM may be simplified.

In one embodiment, the bit-line layers 270 may also be used to electrically connect the doped source/drain regions 230 with other semiconductor devices.

Thus, a DRAM may be formed by the disclosed methods and processes. FIGS. 4-5 illustrate a corresponding DRAM.

As shown in FIGS. 4-5, the DRAM includes a base substrate. A gate structure 220 and an interlayer dielectric layer 240 may be formed on the base substrate; and doped source/drain regions 230 may be formed in the base substrate at two sides of the gate structure 220, respectively. The interlayer dielectric layer 240 may be on the surfaces of the gate structure 220, the base substrate, and doped source/drain regions 230. The DRAM may also include a first opening 251 (referring to FIG. 3) formed in the interlayer dielectric layer 240. The first opening may expose the doped source/drain region 230 at one side of the gate structure 220. Further, the DRAM may also include a memory structure 260 formed in the first opening 251. The memory structure 260 may include a first conductive layer 261 formed on the side and bottom surfaces of the first opening 251, a memory medium layer 262 formed on the first conductive layer 251, and a second conductive layer 263 formed on the memory medium layer 262.

The detailed structures of the base substrate may refer to the above descriptions without being further repeated.

The detailed information, including the position, the structure and the material, of the gate structure 220 refer to the above descriptions without being further repeated.

The detailed information, including the position and the number, of the doped source/drain regions 230 may refer to the above descriptions without being further repeated.

In one embodiment, the memory structure 260 may be a resistance-change memory structure; and the memory medium layer 262 may be made of a resistance-change material. In another embodiment, the memory structure 260 may be a phase-change memory structure; and the memory medium layer 262 may be made of a phase-change material. In some embodiments, the memory structure 260 may be a capacitive memory structure; and the memory medium layer 262 may be made of a capacitive medium material.

The resistance-change material may include hafnium oxide, zirconium oxide, copper oxide, or zinc oxide, etc. The phase-change material may include chalcogenide, or germanium, antimony and/or tellurium compounds. The capacitive medium material may include hafnium oxide, aluminum oxide, or zirconium oxide, etc.

The gate structure 220 may include a first side and an opposing second side. The first side and the second side of the gate structure 220 may expose the doped source/drain regions 230.

The first openings 251 may locate at the first side of the gate structure 220.

When the number of the doped source/drain regions 230 at the first side of the gate structure 220 along the direction parallel to the length direction of the gate structure 220 is more than one; and the number of the doped source/drain regions 230 at the second side of the gate structure 220 along the direction parallel to the length direction of the gate structure 220 is more than one, the number of the first conductive layers 261 along the direction parallel to the length direction of the gate structure 220 is also more than one. Each first conductive layer 261 may be on the surface of a corresponding doped source or drain region 230 at the first side of the gate structure 220. The first conducive layers 261 may be disposed discretely.

The DRAM may also include a second opening 252 (referring to FIG. 3). The second opening 252 may pass through the interlayer dielectric layer 240; and expose the second doped source/drain region 230 at the second side of the gate structure 220.

The DRAM may also include a bit-line layer 270. The bit-line layer 270 may be formed in the second opening 252.

When the number of the doped source/drain regions 230 at the first side of the gate structure 220 along the direction parallel to the length direction of the gate structure 220 is more than one; and the number of the doped source/drain regions 230 at the second side of the gate structure 220 along the direction parallel to the length direction of the gate structure 220 is more than one, the number of the bit-line layers 270 along the direction parallel to the length direction of the gate structure 220 is also more than one. Each bit-line layer 270 may be on the surface of a corresponding doped source or drain region 230 at the second side of the gate structure 220. The bit-line layers 270 may be disposed discretely.

In the disclosed DRAM, the memory structure 260 may be directly in contact with the doped source/drain region 230. Thus, the memory structure 260 and the doped source/drain region 230 may not need to be electrically connected by a multiple-layer interconnect structure. Accordingly, the fabrication process of the DRAM may be simplified.

Thus, in the disclosed methods, the interlayer dielectric layer may be formed on the surfaces of the gate structure, the base substrate and the doped source/drain regions; and a first opening may be formed in the interlayer dielectric layer at one side, i.e., the first side, of the gate structure. The first opening may expose the doped source/drain region at the first side of the gate structure. After forming the memory structure in the first opening, the memory structure may be directly in contact with the doped source/drain region at the first side of the gate structure. Thus, the memory structure and the doped source/drain region may not need to be electrically connected by a multiple-layer interconnect structure. Accordingly, the fabrication process of the DRAM may be simplified.

Further, the memory material layer may be made of a resistance-change material, or a phase change material. The bit-cells of the formed DRAM may be relatively stable; and the stored data may not lose when the supply power source is off. Thus, the performance of the DRAM may be as desired.

In the disclosed DRAM, the memory structure may be directly in contact with the doped source/drain region at the first side of the gate structure. Thus, the memory structure and the doped source/drain region may not need to be electrically connected by a multiple-layer interconnect structure. Accordingly, the fabrication process of the DRAM may be simplified.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A method for fabricating a dynamic random access memory (DRAM), comprising:
   providing a base substrate;
   forming a gate structure over the base substrate;
   forming doped source/drain regions in the base substrate protruding from a top surface of the base substrate at two sides of the gate structure, respectively;
   forming an interlayer dielectric layer over the gate structure, the base substrate and the doped source/drain regions;
   forming a first opening, exposing one of the doped source/drain regions at one side of the gate structure, in the interlayer dielectric layer; and
   forming a memory structure in the first opening and directly on the one of doped source/drain regions, wherein forming the memory structure in the first opening comprises:
      forming a first conductive layer on side and bottom surfaces of the first opening;
      forming a memory medium layer on side and bottom surfaces of the first conductive layer; and
      forming a second conductive layer on the memory medium layer, wherein:
         the first conductive layer has a top surface coplanar with a top surface of the memory medium layer, a top surface of the second conductive layer, and a top surface of the interlayer dielectric layer, and
         the first conductive layer is directly on and electrically connected with the one of doped source/drain regions.

2. The method according to claim 1, wherein:
the gate structure includes a first side and a second side opposing the first side;
the first side and the second side expose the doped source/drain regions, respectively.

3. The method according to claim 2, wherein:
when a number of the doped source/drain regions at the first side of the gate structure along a direction parallel to a length direction of the gate structure is more than one, and a number of the doped source/drain regions at the second side of the gate structure along the direction parallel to the length direction of the gate structure is more than one:
more than one first conductive layer is formed;
each first conductive layer is directly on a surface of and electrically connected with a corresponding doped source or drain region at the first side of the gate structure; and
the first conductive layers are discretely distributed and electrically insulated to each other.

4. The method according to claim 3, the first opening being at the first side of the gate structure and extending to a portion of the base substrate between adjacent doped source/drain regions along the direction parallel to the extension direction of the gate structure, wherein the first conductive layers are formed by:
   forming an initial first conductive material layer on the side and bottom surfaces of the first opening and a surface of the base substrate between adjacent doped source/drain regions; and
   removing portions of the initial first conductive layer on the base substrate between adjacent doped source/drain regions.

5. The method according to claim 2, the first opening being at the first side of the gate structure, further comprising:
   forming a second opening exposing the doped source/drain regions at the second side of the gate structure in the interlayer dielectric layer; and forming a bit-line layer in the second opening, wherein the bit-line layer is discretely distributed along a direction parallel to a length direction of the gate structure.

6. The method according to claim 5, wherein:
the first opening and the second opening are formed simultaneously.

7. The method according to claim 5, wherein:
when a number of the doped source/drain regions at the first side of the gate structure along the direction parallel to the length direction of the gate structure is more than one and a number of the doped source/drain regions at the second side of the gate structure along the direction parallel to the length direction of the gate structure is more than one,
more than one bit-line layer is formed;
each bit-line layer is on a surface of a corresponding doped source/drain regions at the second side of the gate structure; and
the bit-line layers are discretely distributed.

8. The method according to claim 7, the second opening extending to the base substrate between adjacent doped source/drain regions, wherein bit-line layers are formed by:
forming an initial bit-line layer on side and bottom surfaces of the second opening and a surface of the base substrate between adjacent doped source/drain regions; and
removing portions of the initial bit-line layer on the surface of the base substrate between adjacent doped source/drain regions.

9. The method according to claim 1, wherein:
the memory structure is a resistance-change memory structure having the memory medium layer made of a resistance-change material.

10. The method according to claim 9, wherein:
the resistance-change material includes at least one of hafnium oxide, zirconium oxide, copper oxide and zinc oxide;
the phase-change material includes at least one of chalcogenide, germanium, antimony and tellurium compound; and
the capacitive medium material includes at least one of hafnium oxide, aluminum oxide and zirconium oxide.

11. A dynamic random access memory (DRAM), comprising:
a base substrate;
a gate structure formed over the base substrate;
doped source/drain regions formed in the base substrate protruding from a top surface of the base substrate at two sides of the gate structure, respectively;
an interlayer dielectric layer formed on the gate structure, the base substrate and the doped source/drain regions, wherein the interlayer dielectric layer contains a first opening exposing the doped source/drain regions at one side of the gate structure; and
a memory structure directly on the doped source/drain regions at one side of the gate structure, having a first conductive layer on side and bottom surfaces of the first opening, a memory medium layer on the first conductive layer and a second conductive layer on the memory medium layer, formed in the interlayer dielectric layer, wherein:
the first conductive layer has a top surface coplanar with a top surface of the memory medium layer, a top surface of the second conductive layer, and a top surface of the interlayer dielectric layer, and the first conductive layer is directly on and electrically connected with the one of doped source/drain regions.

12. The dynamic random access memory according to claim 11, wherein:
the memory structure is one of a resistance-change structure having the memory medium layer made of a resistance-change material, a phase-change memory structure having the memory medium layer made of a phase-change material, and a capacitive memory structure having the memory medium layer made of a capacitive medium material.

13. The dynamic random access memory according to claim 12, wherein:
the resistance-change material includes at least one of hafnium oxide, zirconium oxide, copper oxide and zinc oxide;
the phase-change material includes at least one of chalcogenide, germanium, antimony and tellurium compound; and
the capacitive medium material includes at least one of hafnium oxide, aluminum oxide and zirconium oxide.

14. The dynamic random access memory according to claim 11, wherein:
the gate structure includes a first side and a second side opposing the first side;
the first side and the second side expose the doped source/drain regions, respectively.

15. The dynamic random access memory according to claim 14, wherein:
when a number of the doped source/drain regions at the first side of the gate structure along a direction parallel to a length direction of the gate structure is more than one and a number of the doped source/drain regions at the second side of the gate structure along a direction parallel to the length direction of the gate structure is more than one,
more than one first conductive layer is formed;
each first conductive layer is on a surface of a corresponding doped source or drain region at the first side of the gate structure; and
the first conductive layers are distributed discretely.

16. The dynamic random access memory according to claim 14, the first opening being at the first side of the gate structure, further comprising:
a second opening, passing through the interlayer dielectric layer and exposing the doped source/drain regions at the second side of the gate structure, formed in the interlayer dielectric layer; and
a bit-line layer formed in the second opening.

17. The dynamic random access memory according to claim 16, wherein:
when a number of the doped source/drain regions at the first side of the gate structure along the direction parallel to the length direction of the gate structure is more than one and a number of the doped source/drain regions at the second side of the gate structure along the direction parallel to the length direction of the gate structure is more than one,
more than one bit-line layer is formed;
each bit-line layer is on a surface of a corresponding doped source/drain regions at the second side of the gate structure; and
the bit-line layers are discretely distributed.

18. The dynamic random access memory according to claim 11, wherein the base substrate comprises:
a semiconductor substrate; and a plurality of fins formed on the semiconductor substrate, wherein:
the gate structure crosses over the plurality of fins; and
the doped source/drain regions are formed in the fins at two sides of the gate structure, respectively.

19. The method according to claim 1, wherein:
the memory structure is a phase-change memory structure having the memory medium layer made of a phase-change material.

20. The method according to claim 1, wherein:
the memory structure is a capacitive memory structure having the memory medium layer made of a capacitive medium material.

* * * * *